(12) United States Patent
Matsushima

(10) Patent No.: US 6,968,486 B2
(45) Date of Patent: Nov. 22, 2005

(54) MASTER-SLAVE-TYPE SCANNING FLIP-FLOP CIRCUIT FOR HIGH-SPEED OPERATION WITH REDUCED LOAD CAPACITY OF CLOCK CONTROLLER

(75) Inventor: Yusuke Matsushima, Tokyo (JP)

(73) Assignee: NEC Corporation, Tokyo (JP)

( * ) Notice: Subject to any disclaimer, the term of this patent is extended or adjusted under 35 U.S.C. 154(b) by 583 days.

(21) Appl. No.: 10/022,428

(22) Filed: Dec. 20, 2001

(65) Prior Publication Data
US 2002/0078410 A1    Jun. 20, 2002

(30) Foreign Application Priority Data
Dec. 20, 2000  (JP)  .............................. 2000-387597

(51) Int. Cl.[7] ...................... G01R 31/28; H03K 3/289; G11C 11/00
(52) U.S. Cl. ...................... 714/726; 327/202; 365/154
(58) Field of Search ............................... 714/724–731; 324/763, 765; 326/63, 82, 92, 96, 16; 365/154; 327/202

(56) References Cited

U.S. PATENT DOCUMENTS 4,495,629 A * 1/1985 Zasio et al. ................. 377/70
5,633,606 A * 5/1997 Gaudet et al. ............... 327/202

FOREIGN PATENT DOCUMENTS

| JP | 63-253272 | 10/1988 |
| JP | 63253272 | * 10/1988 | .......... G01R 31/28 |
| JP | 05-160682 | 6/1993 |
| JP | 5-267999 | 10/1993 |

* cited by examiner

Primary Examiner—Albert Decady
Assistant Examiner—John J. Tabone, Jr.
(74) Attorney, Agent, or Firm—Young & Thompson

(57) ABSTRACT

A master-slave-type scanning flip-flop circuit is capable of operating at a higher speed by reducing a load capacity of a clock controller. The master-slave-type scanning flip-flop circuit is used to test a semiconductor integrated circuit device, and has a master latch and a slave latch each for temporarily holding an input signal, a first scan controller, a clock controller, and a second scan controller. The first scan controller receives an output signal from the master latch and outputs the received output signal in synchronism with a scan clock which is a clock for testing the semiconductor integrated circuit device, when the semiconductor integrated circuit device is tested. The clock controller receives an output signal from the first scan controller and outputs the received output signal to the slave unit in synchronism with a predetermined clock when in a normal mode of operation. The second scan controller has an input terminal connected to an output terminal of the first scan controller, and outputs a scan-out signal corresponding to a scan-in signal which is an input signal for testing the semiconductor integrated circuit device, in synchronism with the scan clock when the semiconductor integrated circuit device is tested.

2 Claims, 7 Drawing Sheets

Fig. 2
PRIOR ART

| D | C | SIN | SC1 | SC2 | Q | QB | SOUT | MODE |
|---|---|-----|-----|-----|---|----|------|------|
| 0 | ↑ | X | 0 | 1 | 0 | 1 | 1 | NORMAL |
| 1 | ↑ | X | 0 | 1 | 1 | 0 | 0 | |
| X | 0 | X | X | 1 | HOLD | | | |
| X | 1 | SIN | ↑ | ↑ | SINB SIN | SIN | | SCAN SHIFT |
| X | 1 | X | X | 0 | HOLD | | | |

MASTER-SLAVE-TYPE SCANNING FLIP-FLOP CIRCUIT FOR HIGH-SPEED OPERATION WITH REDUCED LOAD CAPACITY OF CLOCK CONTROLLER

BACKGROUND OF THE INVENTION

1. Field of the Invention

The present invention relates to a scanning flip-flop circuit for use as a flip-flop circuit in testing a semiconductor integrated circuit device.

2. Description of the Related Art

Since semiconductor integrated circuit devices (hereinafter referred to as "LSI circuits") in recent years are larger in scale and more highly packed than before, it is impossible to test them unless their LSI chips incorporate some design for making the test easier. One known method of making LSI circuit tests easier is a scan path method. According to the scan path method, various flip-flop circuits in an LSI circuit are connected in a chain pattern so as to operate as a shift register, and, when the LSI circuit is tested, the shifting function of the shift register is used to control and observe values of the flip-flop circuits from outside of the LSI circuit.

In order to test an LSI circuit according to the scan path method, a plurality of scanning flip-flop circuits are provided as testing flip-flop circuits in the LSI circuit, and testing input and output terminals of the scanning flip-flop circuits are connected in series to each other, making up a shift register.

A scanning flip-flop circuit is a circuit having a normal function to operate as an ordinary flip-flop circuit and also a scanning operation function. The scanning operation function allows the scanning flip-flop circuit to operate as a flip-flop circuit with a scan clock SC which is a testing clock while a scan-in signal SIN as a testing pattern signal is applied as a data input signal. One conventional arrangement of such a scanning flip-flop circuit is shown in FIG. 1 of the accompanying drawings. The scanning flip-flop circuit shown in FIG. 1 has a master-slave-type D flip-flop circuit arrangement.

As shown in FIG. 1, the conventional scanning flip-flop circuit comprises master latch 1, slave latch 2, clock controller 3, scan controller 4, scan controller 5, clock controller 6, and scan controller 7.

Master latch 1 temporarily holds data signal D or scan-in signal SIN. Slave latch 2 temporarily holds an output signal from master latch 1 in synchronism with clock C for normal operation. Clock controller 3 outputs data signal D to master latch 1 in synchronism with clock C. Scan controller 4 outputs scan-in signal SIN to master latch 1 in synchronism with scan clock SC1. Scan controller 5 receives the output signal from master latch 1 and outputs the received signal in synchronism with scan clock SC2. Clock controller 6 receives the output signal from the scan controller 5 and outputs the received signal to slave latch 2 in synchronism with clock C. Scan controller 7 outputs scan-out signal SOT which represents a scan result in synchronism with scan clock SC2.

A signal output from slave latch 2 is output via a buffer (inverter INV1) as output data Q from terminal N01. The signal output from scan controller 7 is output via a buffer (inverter INV2) as scan-output signal SOT from terminal N02.

To master latch 1, slave latch 2, clock controller 3, and clock controller 6, there are connected output terminal P01 of inverter INV3 which inverts clock C and output terminal P02 of inverter INV4 which inverts an output clock of inverter INV3.

To master latch 1 and scan controller 4, there are connected input terminal H04 for inputting scan clock SC1 and output terminal P03 of inverter INV5 which inverts scan clock SC1. To scan controller 5 and scan controller 7, there are connected input terminal H05 for inputting scan clock SC2 and output terminal CB1 of inverter INV6 which inverts scan clock SC2.

Master latch 1 comprises inverter INV11, inverter INV12 for inverting an output signal from inverter INV11, and transfer gates TG11, TG12 inserted in series between the output terminal of inverter INV12 and the input terminal of inverter INV11. To transfer gate TG11, there are connected output terminal P01 of inverter INV3 and output terminal P02 of of inverter INV4. To transfer gate TG12, there are connected terminal H04 and output terminal P03 of inverter INV5.

Slave latch 2 comprises inverter INV21, inverter INV22 for inverting an output signal from inverter INV21, and transfer gate TG21 inserted between the output terminal of inverter INV22 and the input terminal of inverter INV21. To transfer gate TG21, there are connected output terminal P01 of inverter INV3 and output terminal P02 of inverter INV4.

Clock controller 3 comprises inverter INV31 for inverting data signal D and transfer gate TG31 which is turned on and off in synchronism with clock C. To transfer gate TG31, there are connected output terminal P01 of inverter INV3 and output terminal P02 of inverter INV4.

Scan controller 4 has transfer gate TG41 which is supplied with scan-in signal SIN and turned on and off in synchronism with scan clock SC1. To transfer gate TG41, there are connected terminal H04 and output terminal P03 of inverter INV5.

Scan controller 5 has transfer gate TG51 which is supplied with the output signal from master latch 1 and turned on and off in synchronism with scan clock SC2. To transfer gate TG51, there are connected terminal H05 and output terminal CB1 of inverter INV6.

Clock controller 6 has transfer gate TG61 which is supplied with the output signal from scan controller 5 and turned on and off in synchronism with clock C. To transfer gate TG61, there are connected output terminal P01 of inverter INV3 and output terminal P02 of inverter INV4.

Scan controller 7 has transfer gate TG71 which is supplied with the output signal from clock controller 6 and turned on and off in synchronism with scan clock SC2. To transfer gate TG71, there are connected terminal H05 and output terminal CB1 of inverter INV6.

Each of the transfer gates comprises a PMOS transistor and an NMOS transistor whose sources and drains are connected in common, and operates as a switch that is turned on and off depending on a control signal applied to the gates of the PMOS transistor and the NMOS transistor.

Operation of the conventional scanning flip-flop circuit shown in FIG. 1 will be described below.

In a normal mode of operation of the scanning flip-flop circuit shown in FIG. 1, scan clock SC1 is kept at L level and scan clock SC2 is kept at H level. Therefore, transfer gate TG12 of master latch 1 and transfer gate TG51 of scan controller 5 are kept in ON state, and transfer gate TG41 of scan controller 4 and transfer gate TG71 of scan controller 7 are kept in OFF state.

When data signal D of H or L level is supplied from terminal H01 and clock C goes high, transfer gate TG31 of clock controller 3 is turned on, supplying data signal D to master latch 1.

In master latch 1, the signal received from clock controller 3 is inverted by inverter INV11 and output to scan controller 5. Since transfer gate TG51 of scan controller 5 is kept in ON state, as described above, the output signal from master latch 1 is applied as it is to clock signal 6. Because transfer gate TG61 is turned off when clock C goes low (L level), clock controller 6 outputs nothing.

When clock C goes high, because transfer gate TG31 is turned off, clock controller 3 stops outputting the data to master latch 1.

In master latch 1, transfer gate TG11 is turned on in synchronism with the falling edge of clock C, feeding back the output signal of inverter INV12 via transfer gates TG11, TG12 to the input terminal of inverter INV11. Therefore, the output signal from master latch 1 is kept at the value (H level or L level) when clock C is at L level.

When clock C goes high, transfer gate TG61 of clock controller 6 is turned on. Thus, clock controller 6 outputs the signal received from scan controller 5 to slave latch 2.

Inverter INV21 of slave latch 2 inverts the signal received from clock controller 6, and outputs the inverted signal. Terminal N01 outputs the signal from slave latch 2 which is inverted by inverter INV1.

When clock C goes low again, since transfer gate TG61 of clock controller 6 is turned off again, clock controller 6 stops outputting the data to slave latch 2.

In slave latch 2, transfer gate TG21 is turned on, feeding back the output signal of inverter INV22 via transfer gate TG21 to the input terminal of inverter INV21. Therefore, the output signal from slave latch 2 is kept at the value (H level or L level) when clock C is at L level.

In a scan mode of operation of the scanning flip-flop circuit shown in FIG. 1, since clock C is kept at H level, transfer gate TG11 of master latch 1 and transfer gate TG61 of clock controller 6 are kept in ON state, and transfer gate TG31 of clock controller 3 and transfer gate TG21 of slave latch 2 are kept in OFF state.

When scan-in signal of H or L level is supplied from terminal H03 and scan clock SC1 goes high, since transfer gate TG41 of scan controller 4 is turned on, scan controller 4 outputs scan-in signal SIN from terminal H03 to master latch 1.

In master latch 1, the signal received from scan controller 4 is inverted by inverter INV11 and output to scan controller 5.

Since scan clock SC2 is at L level and transfer gate TG51 is turned off, scan controller 5 outputs nothing.

When scan clock SC1 goes low, because transfer gate TG41 is turned off, scan controller 4 stops outputting the data to master latch 1.

In master latch 1, when scan clock SC1 goes low, transfer gate TG11 is turned on, feeding back the output signal of inverter INV12 via transfer gates TG11, TG12 to the input terminal of inverter INV11. Therefore, the output signal from master latch 1 is kept at the value (H level or L level) when clock C is at H level.

When scan clock SC2 goes high, since transfer gate TG51 is turned on, scan controller 5 outputs the data received from master latch 1 to clock controller 6.

Since transfer gate TG61 of clock controller 6 is kept in ON state, clock controller 6 outputs the signal received from scan controller 5 as it is to slave latch 2 and scan controller 7.

Inverter INV21 of slave latch 2 inverts the data received from clock controller 6 and outputs the inverted signal.

Because transfer gate TG71 is turned off, scan controller 7 outputs nothing.

When scan clock SC2 goes low, because transfer gate TG51 is turned off, scan controller 5 stops outputting the data to clock controller 6.

When scan clock SC2 goes low, transfer gate TG71 of scan controller 7 is turned on, feeding back the output signal of inverter INV22 via transfer gate TG71 to the input terminal of inverter INV21. Therefore, scan controller 7 keeps the output signal at the value (H level or L level) when scan clock SC is at H level.

The details of the above operation are set forth in a truth table shown in FIG. 2 of the accompanying drawings.

In FIG. 2, "X" represents an undefined state, the arrows the rising of the clock, "QB" the inversion of "Q", "SINB" the inversion of "SIN", "NORMAL" the normal mode of operation, and "SCAN SHIFT" the scan mode of operation.

As described above, the scanning flip-flop circuit shown in FIG. 1 is a master-slave-type flip-flop circuit. A J-K flip-flop circuit shown in FIG. 3 of the accompanying drawings or a T flip-flop circuit shown in FIG. 4 of the accompanying drawings is also known as a master-slave-type flip-flop circuit.

FIG. 3 shows another conventional scanning flip-flop circuit arrangement, which comprises a J-K flip-flop circuit, and FIG. 4 shows still another conventional scanning flip-flop circuit arrangement, which comprises a T flip-flop circuit.

As shown in FIG. 3, the master-slave-type J-K flip-flop circuit comprises master latch 11, slave latch 12, clock controller 13, scan controller 14, clock controller 16, scan controller 17, and selector circuit 18.

Master latch 11 temporarily holds data signals J, K or scan-in signals SINJ, SINK. Slave latch 12 temporarily holds an output signal from master latch 11 in synchronism with clock C for normal operation. Clock controller 13 outputs data signals J, K to master latch 11 in synchronism with clock C. Scan controller 14 outputs scan-in signals SINJ, SINK to master latch 11 in synchronism with scan clock SC1. Clock controller 16 receives the output signal from master latch 11 and outputs the received signal in synchronism with clock C. Scan controller 17 outputs scan-out signal SOT which represents a scan result in synchronism with scan clock SC2. Selector circuit 18 outputs either data signals J, K or scan-in signals SINJ, SINK to master latch 11 according to test mode signal SMD.

As shown in FIG. 4, the master-slave-type T flip-flop circuit comprises master latch 21, slave latch 22, selector circuit 28, clock controller 23, clock controller 26, and scan controller 27.

Master latch 21 temporarily holds data signal J or scan-in signal SIN. Slave latch 22 temporarily holds an output signal from master latch 21. Selector circuit 28 outputs either data signal J or scan-in signal SIN to master latch 21 according to test mode signal SMD. Clock controller 23 receives the output signal from selector circuit 28 and controls the outputting of data signal J or scan-in signal SIN to master latch 21. Clock controller 26 receives the output signal from master latch 21 and controls the outputting of a signal to slave latch 22. Scan controller 27 outputs scan-out signal SOT which represents a scan result in synchronism with scan clock SC1.

Each of the master latch and the slave latch of the J-K flip-flop circuit shown in FIG. 3 and the T flip-flop circuit shown in FIG. 4 comprises an RS flip-flop circuit having two NAND gates. Each of the clock controller, the scan controller, the clock controller, and the scan controller is a circuit comprising logic gates including NAND gates, inverters, etc.

With the J-K flip-flop circuit shown in FIG. 3 and the T flip-flop circuit shown in FIG. 4, either the data signal or the scan-in signal is selected by test mode signal SMD. In a normal mode of operation, the data signal is supplied to the master latch. In a scan mode of operation, the scan-in signal is supplied to the master latch.

In the J-K flip-flop circuit shown in FIG. 3, data signals J, K are introduced into master latch 11 in synchronism with a falling edge of clock C, and scan-in signals SINJ, SINK are introduced into master latch 11 in synchronism with a rising edge of scan clock SC1. Scan-out signal SOT is output from scan controller 17 in synchronism with a rising edge of scan clock SC2.

In the T flip-flop circuit shown in FIG. 4, data signal J or scan-in signal SIN selected by selector circuit 28 is introduced as it is into master latch 21. Scan-out signal SOT is output from scan controller 27 in synchronism with a rising edge of scan clock SC1.

In recent years, systems such as computers or the like have an operating clock whose frequency is becoming higher and higher as the system performance increases. Therefore, circuit delay times of gates and flip-flop circuits as circuit elements of LSI circuits used in the systems need to be reduced. It is not preferable for the delay times to be increased by the addition of a test circuit.

With the conventional scanning flip-flop circuit shown in FIG. 1, since not only inverter INV21 and transfer gate TG21 of slave latch 2 used in the normal mode of operation, but also transfer gate TG71 of scan controller 7 used in the scan mode of operation are connected as loads to the output terminal of transfer gate TG61 of clock controller 6 which is connected in a signal path for the normal mode of operation, the load capacity of transfer gate TG61 is increased, resulting in an increase in the delay time.

Similarly, with the conventional scanning flip-flop circuits shown in FIGS. 3 and 4, not only the NAND gates of slave latch 12 or 22 used in the normal mode of operation, but also NAND gates of scan controllers 17, 27 used in the scan mode of operation are connected as loads to the output terminal of clock controller 16 or 26 which is connected in a signal path for the normal mode of operation, the load capacity of clock controller 16 or 26 is increased, resulting in an increase in the delay time.

SUMMARY OF THE INVENTION

It is therefore an object of the present invention to provide a scanning flip-flop circuit which is capable of operating at a higher speed while suppressing an increase in a delay time that is caused by adding a testing circuit.

According to an aspect of the present invention, a scanning flip-flop circuit is used to test a semiconductor integrated circuit device, and has a master latch and a slave latch each for temporarily holding an input signal, a first scan controller, a clock controller, and a second scan controller. The scanning flip-flop circuit operates as a D flip-flop circuit. The first scan controller receives an output signal from the master latch and outputs the received output signal in synchronism with a scan clock which is a clock for testing the semiconductor integrated circuit device, when the semiconductor integrated circuit device is tested. The clock controller receives an output signal from the first scan controller and outputs the received output signal to the slave unit in synchronism with a predetermined clock when in a normal mode of operation. The second scan controller has an input terminal connected to an output terminal of the first scan controller, and outputs a scan-out signal corresponding to a scan-in signal which is an input signal for testing the semiconductor integrated circuit device, in synchronism with the scan clock when the semiconductor integrated circuit device is tested.

In the above scanning flip-flop circuit, since the second scan controller is connected to the output terminal of the first scan controller, rather than the clock controller, the load capacity of the clock controller connected in a signal path when the scanning flip-flop circuit is in the normal mode of operation is reduced to shorten a delay time.

According to another aspect of the present invention, a scanning flip-flop circuit is used to test a semiconductor integrated circuit device, and has a master latch and a slave latch each for temporarily holding an input signal, a clock controller, and a scan controller. The scanning flip-flop circuit operates as a J-K flip-flop circuit. The clock controller receives an output signal from the master latch and outputs the received output signal to the slave unit in synchronism with a predetermined clock when in a normal mode of operation. The scan controller has an input terminal connected to an output terminal of the master latch, and outputs a scan-out signal corresponding to a scan-in signal which is an input signal for testing the semiconductor integrated circuit device, in synchronism with a scan clock which is a clock for testing the semiconductor integrated circuit device when the semiconductor integrated circuit device is tested.

According to still another aspect of the present invention, a scanning flip-flop circuit is used to test a semiconductor integrated circuit device, and has a master latch and a slave latch each for temporarily holding an input signal, a clock controller, and a scan controller. The scanning flip-flop circuit operates as a T flip-flop circuit. The clock controller receives an output signal from the master latch and outputs the received output signal to the slave unit in synchronism with a data signal supplied to the scanning flip-flop circuit when in a normal mode of operation. The scan controller has an input terminal connected to an output terminal of the master latch, and outputs a scan-out signal corresponding to a scan-in signal which is an input signal for testing the semiconductor integrated circuit device, in synchronism with a scan clock which is a clock for testing the semiconductor integrated circuit device when the semiconductor integrated circuit device is tested.

In the above scanning flip-flop circuits, since the scan controller is connected to the output terminal of the master latch, rather than the clock controller, the load capacity of the clock controller connected in a signal path when the scanning flip-flop circuit is in the normal mode of operation is reduced to shorten a delay time. therefore, the overall delay time of the scanning flip-flop circuit is shortened. The scanning flip-flop circuits according to the present invention can use many resources of conventional flip-flop circuits because they do not need changes in logic operation.

The above and other objects, features, and advantages of the present invention will become apparent from the following description with reference to the accompanying drawings which illustrate examples of the present invention.

BRIEF DESCRIPTION OF THE DRAWINGS

FIG. 2 is a truth table illustrative of operation of the scanning flip-flop circuit shown in FIG. 1;

DETAILED DESCRIPTION OF THE PREFERRED EMBODIMENTS

Figure 5:
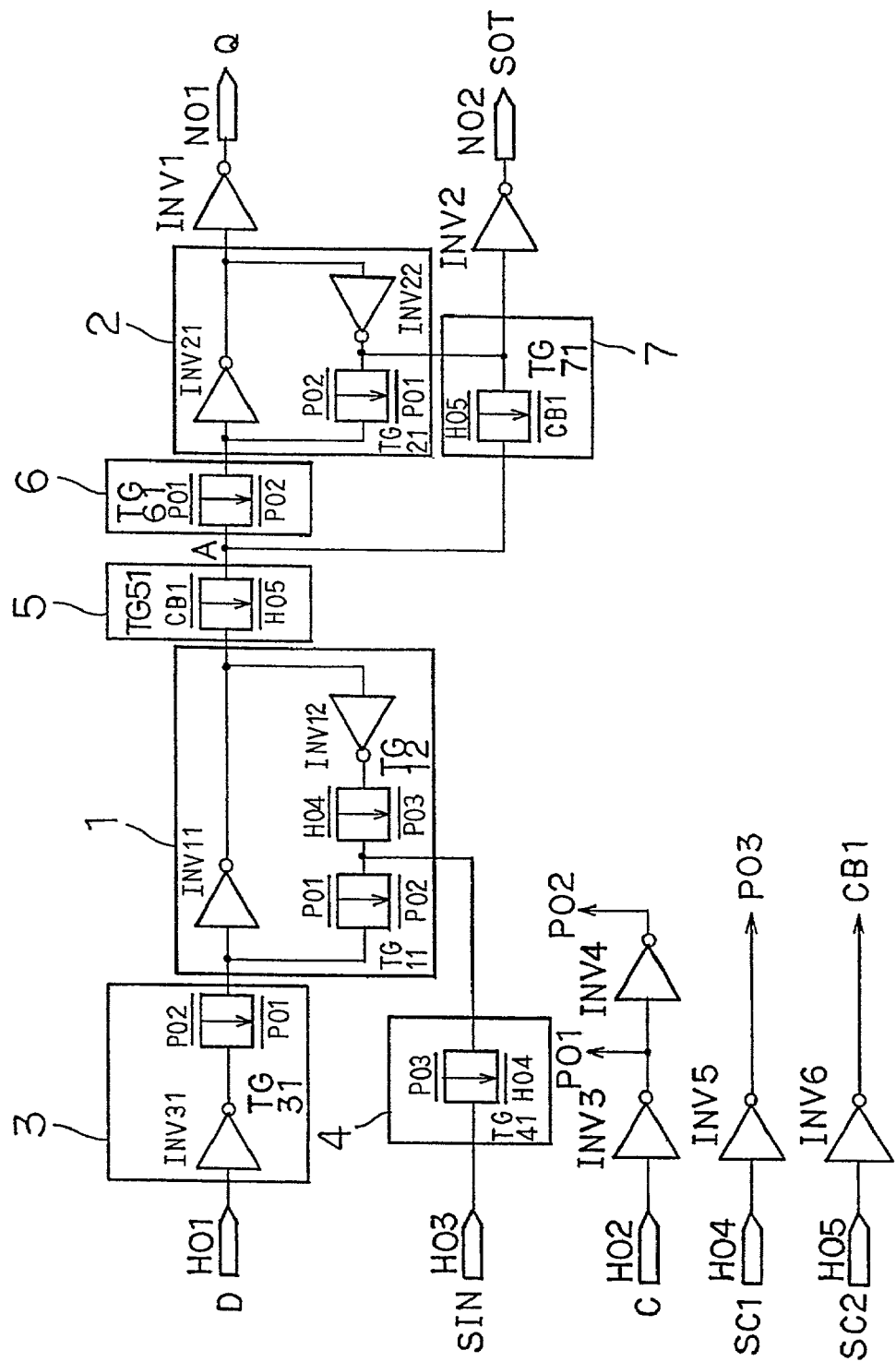
FIG. 5 is a block diagram of a scanning flip-flop circuit according to an embodiment of the present invention.

As shown in FIG. 5, a scanning flip-flop circuit according to an embodiment of the present invention comprises master latch 1, slave latch 2, clock controller 3, scan controller 4, scan controller 5, clock controller 6, and scan controller 7.

Master latch 1 temporarily holds data signal D or scan-in signal SIN. Slave latch 2 temporarily holds an output signal from master latch 1 in synchronism with clock C for normal operation. Clock controller 3 outputs data signal D to master latch 1 in synchronism with clock C. Scan controller 4 outputs scan-in signal SIN to master latch 1 in synchronism with scan clock SC1. Scan controller 5 receives the output signal from master latch 1 and outputs the received signal in synchronism with scan clock SC2. Clock controller 6 receives the output signal from the scan controller 5 and outputs the received signal to slave latch 2 in synchronism with clock C. Scan controller 7 outputs scan-out signal SOT which represents a scan result in synchronism with scan clock SC2.

Figure 1:
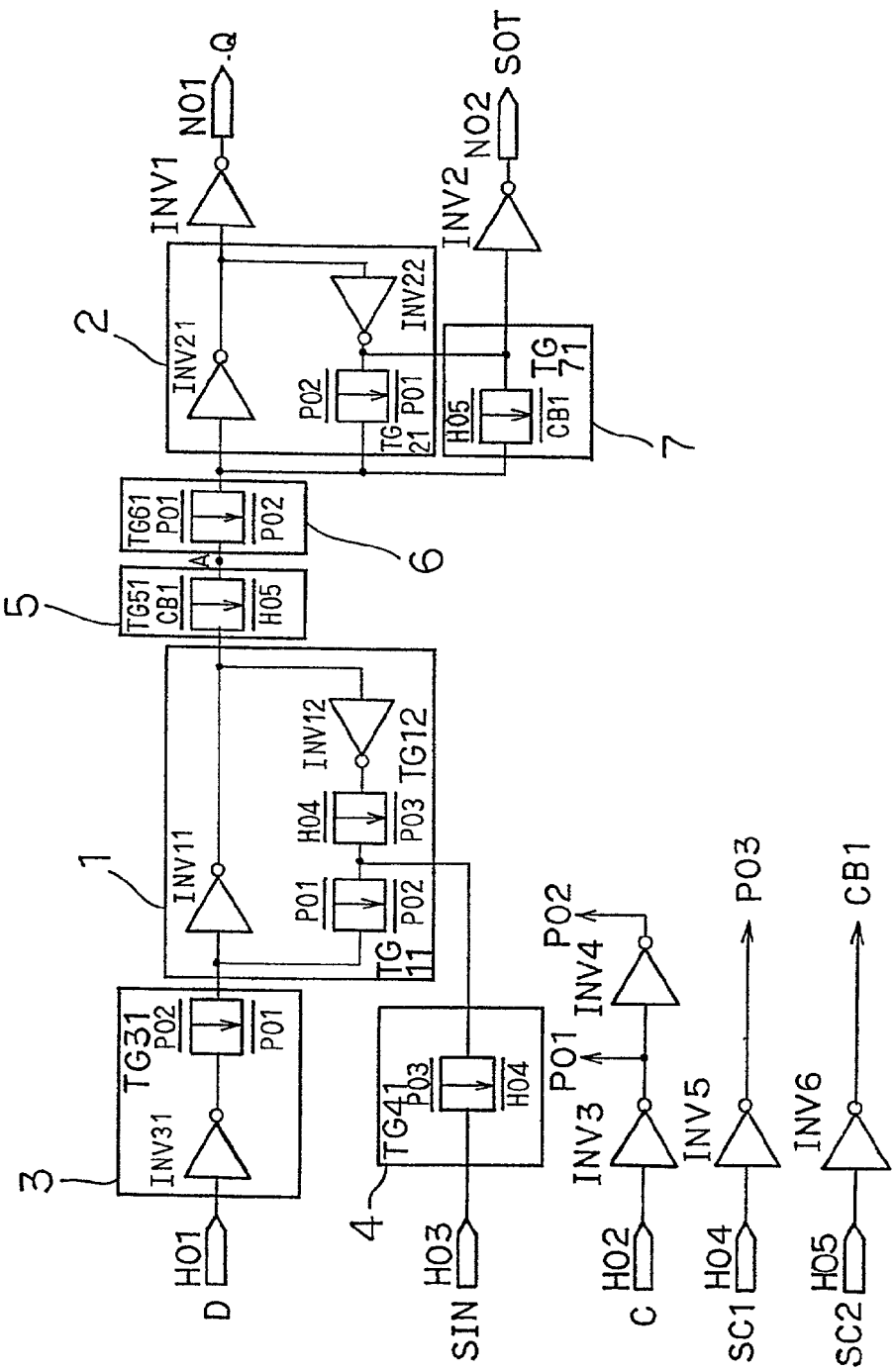
FIG. 1 is a block diagram of a conventional scanning flip-flop circuit.

The scanning flip-flop circuit according to the present embodiment differs from the conventional scanning flip-flop circuit shown in FIG. 1 in that the input terminal of scan controller 7 is connected to the output terminal of scan controller 5. Other structural details of the scanning flip-flop circuit according to the present embodiment are identical to those of the conventional scanning flip-flop circuit shown in FIG. 1, and will not be described in detail below.

Operation of the scanning flip-flop circuit according to the present embodiment will be described below.

Generally, the delay time of a transfer gate is proportional to (the resistance value of the transfer gate when it is turned on)×(load capacity). Therefore, if the resistance value of the transfer gate is represented by R, the load capacity at the time the transfer gate is connected as a load by C1, and the load capacity at the time an inverter is connected as a load by C2, then the delay time Td1 of transfer gate TG61 of clock controller 6 is expressed by the following equation:

$$Td1 = R \times (C1+C2) = RC1+RC2 \quad (1)$$

The delay time Td2 of transfer gate TG61 of clock controller 6 in the conventional scanning flip-flop circuit shown in FIG. 1 is expressed by the following equation:

$$Td2 = R \times (2 \times C1+C2) = 2RC1+RC2 \quad (2)$$

Consequently, the delay time of clock controller 6 is improved by a reduction in the load capacity which results from the fact that transfer gate TG71 of scan controller 7 is not connected.

As shown in FIG. 5, the delay time of transfer gate TG51 of scan controller 5 is increased as the load capacity is increased because not only transfer gate TG61 of clock controller 6, but also transfer gate TG71 of scan controller 7, is connected to the output terminal of transfer gate TG51.

As described above, in a normal mode of operation of the scanning flip-flop circuit, data signal D that is introduced when clock C goes low reaches node A at the output terminal of scan controller 5, and, in synchronism with a rising edge of clock C, transfer gate TG61 of clock controller 6 is turned on, outputting data signal D via slave latch 2 and inverter INV1.

Accordingly, even if a scanning circuit is added between terminal H01 for inputting data signal D and node A, increasing the delay time, the delay time of the scanning flip-flop circuit in operation is not increased. In the conventional scanning flip-flop circuit shown in FIG. 1, however, if the delay time of transfer gate TG61 of clock controller 6 is increased, the delay time of the scanning flip-flop circuit is increased.

According to the present embodiment, therefore, the overall delay time of the scanning flip-flop circuit is shortened as the delay time that occurs until the signal from node A reaches output terminal N01 is shorter than with the conventional scanning flip-flop circuit shown in FIG. 1.

Of the path from node A to output terminal N01, only the delay time of transfer gate TG61 according to the present embodiment is different from that of the conventional scanning flip-flop circuit, but the delay times of the other circuits of the scanning flip-flop circuit according to the present embodiment are the same as those of the conventional scanning flip-flop circuit. Therefore, many of design resources of the conventional scanning flip-flop circuit can be used.

Figure 3:
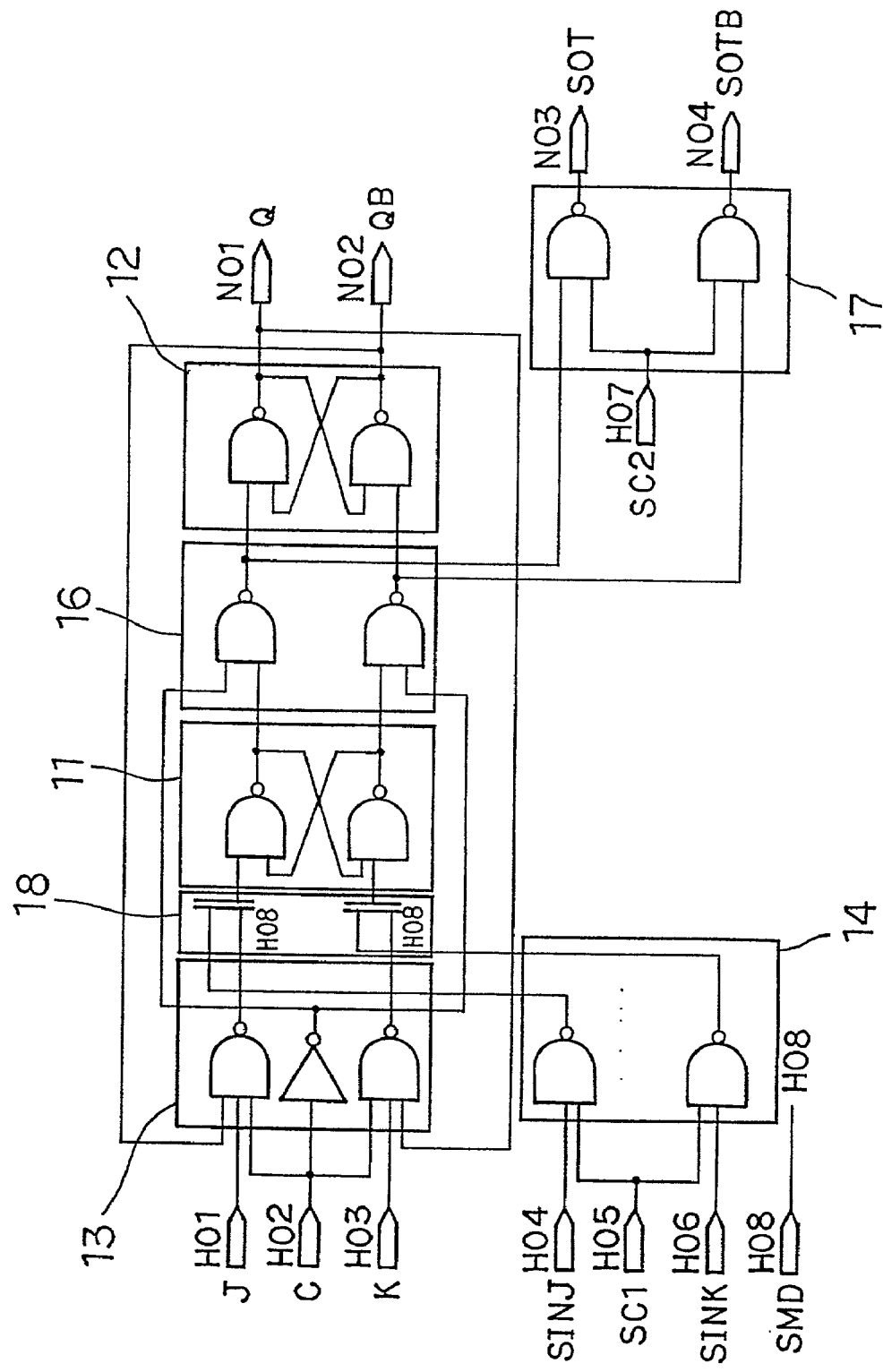
FIG. 3 is a block diagram of another conventional scanning flip-flop circuit which comprises a J-K flip-flop circuit.
Figure 4:
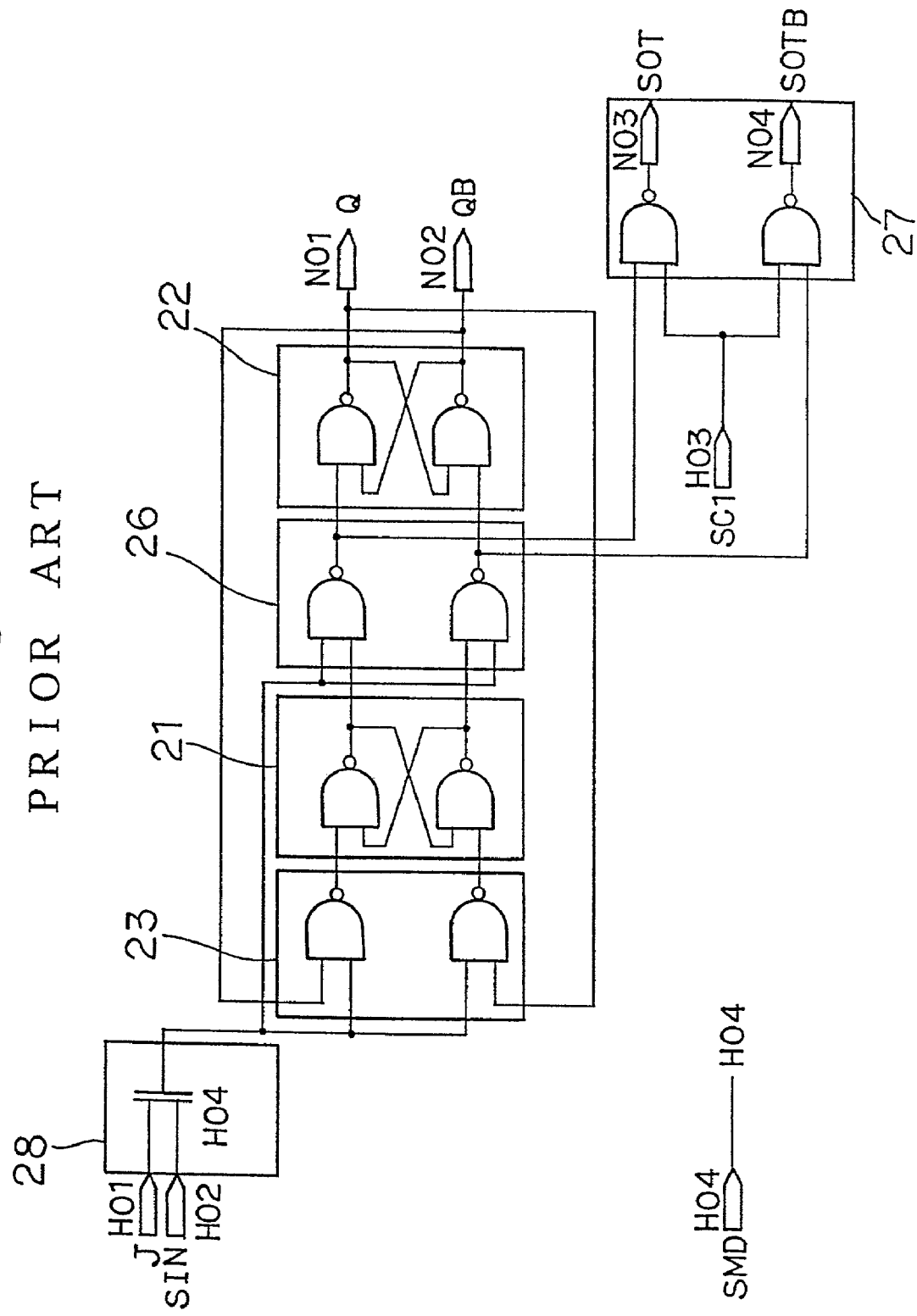
FIG. 4 is a block diagram of still another conventional scanning flip-flop circuit which comprises a T flip-flop circuit.

In the above embodiment, the master-slave-type D flip-flop circuit has been described as the scanning flip-flop circuit. However, the principles of the present invention are also applicable to the J-K flip-flop circuit shown in FIG. 3 and the T flip-flop circuit shown in FIG. 4 to achieve the same advantages as those of the present embodiment insofar as they are of the master-slave type.

Figure 6:
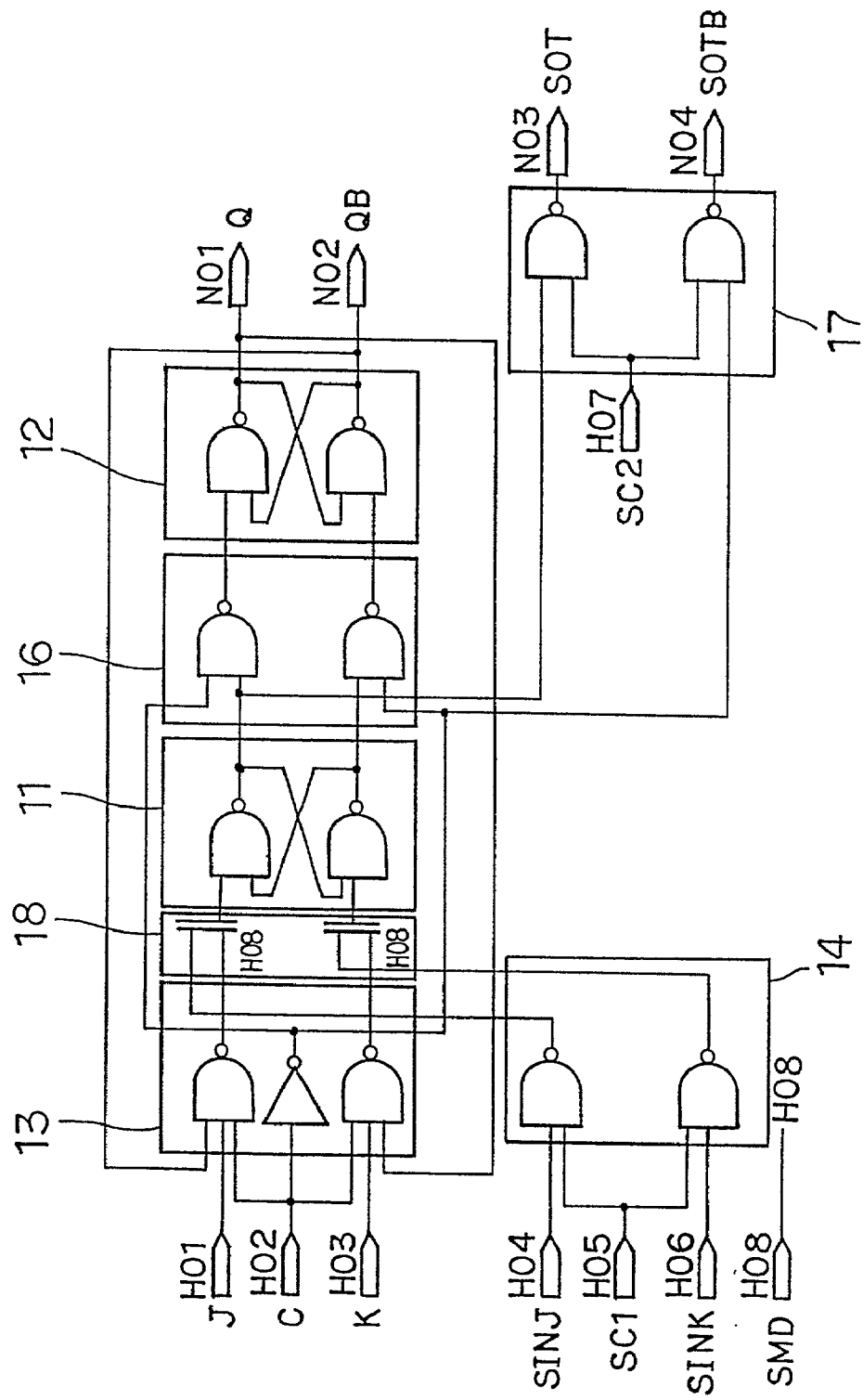
FIG. 6 is a block diagram of a scanning flip-flop circuit according to another embodiment of the present invention which comprises a J-K flip-flop circuit.
Figure 7:
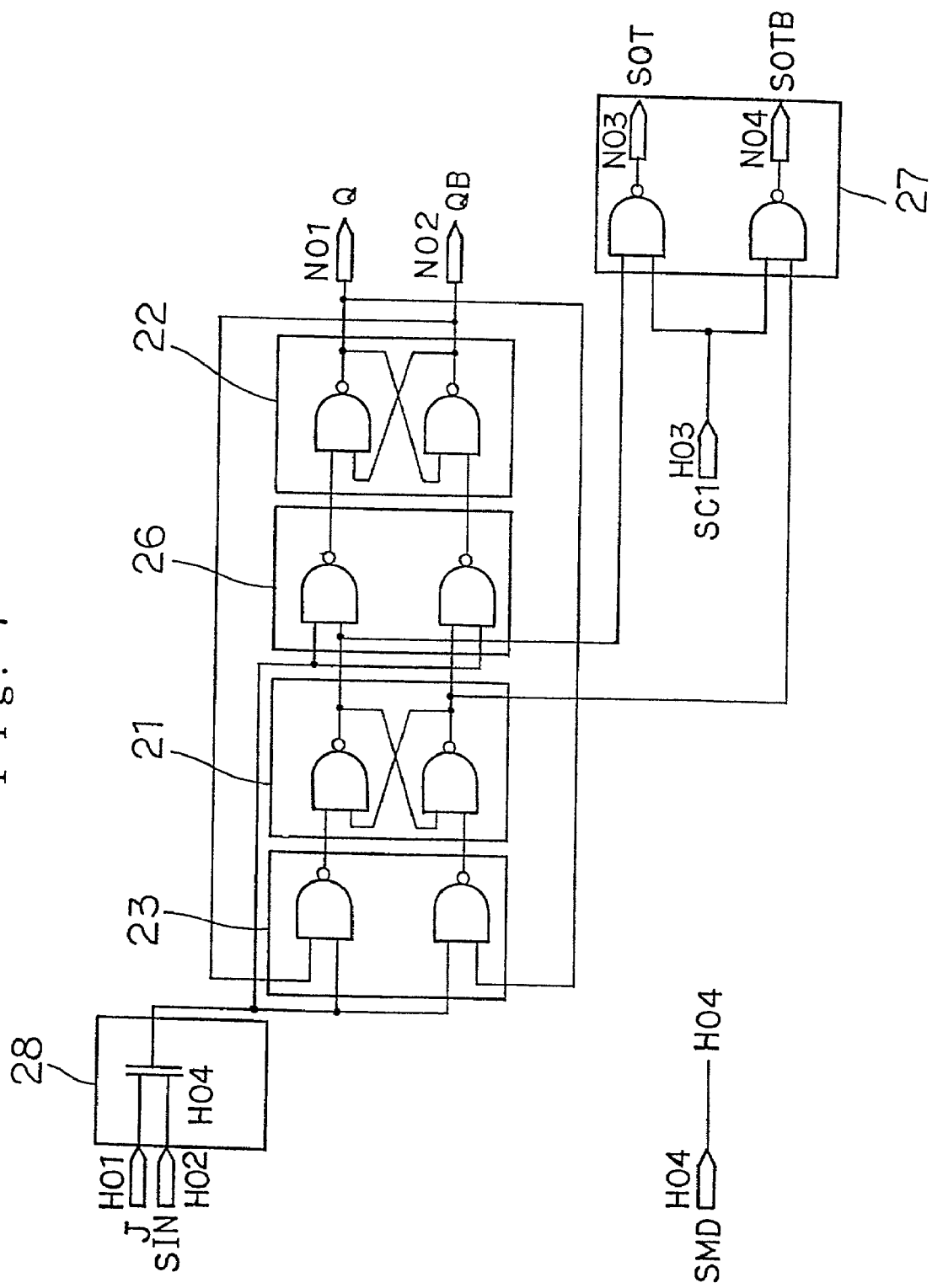
FIG. 7 is a block diagram of a scanning flip-flop circuit according to still another embodiment of the present invention which comprises a T flip-flop circuit.

FIG. 6 shows in block form a scanning flip-flop circuit according to another embodiment of the present invention which comprises a J-K flip-flop circuit. FIG. 7 shows in block form a scanning flip-flop circuit according to still another embodiment of the present invention which comprises a T flip-flop circuit.

As shown in FIGS. 6 and 7, scan controllers 17, 27 which have heretofore been connected as loads of clock controllers 16, 26 are connected as loads of master latches 11, 21 for thereby reducing the load capacities of clock controllers 16, 26 that are connected in the signal path for normal operation to make the delay time caused until the signal from the input terminals of clock controllers 16, 26 reaches output terminal N01, shorter than with the conventional scanning flip-flop circuit. As a result, the overall delay time of the scanning flip-flop circuit can be reduced.

While preferred embodiments of the present invention have been described using specific terms, such description is for illustrative purposes only, and it is to be understood that changes and variations may be made without departing from the spirit or scope of the following claims.

What is claimed is:

1. A master-slave-type scanning flip-flop circuit for use in testing a semiconductor integrated circuit device, comprising:

a master latch and a slave latch each for temporarily holding an input signal;

a first scan controller for receiving an output signal from said master latch and outputting the received output signal in synchronism with a scan clock which is a clock for testing the semiconductor integrated circuit device, when the semiconductor integrated circuit device is tested;

a clock controller for receiving an output signal from said first scan controller and outputting the received output signal to said slave unit in synchronism with a predetermined clock when in a normal mode of operation; and a second scan controller having an input terminal connected to an output terminal of said first scan controller, for outputting a scan-out signal corresponding to a scan-in signal which is an input signal for testing the semiconductor integrated circuit device, in synchronism with said scan clock when the semiconductor integrated circuit device is tested.

2. A master-slave-type scanning flip-flop circuit according to claim 1, wherein said scanning flip-flop circuit comprises a D flip-flop circuit.

* * * * *